United States Patent
Hayashi et al.

(10) Patent No.: US 6,228,662 B1
(45) Date of Patent: May 8, 2001

(54) METHOD FOR REMOVING SHORT-CIRCUITED SECTIONS OF A SOLAR CELL

(75) Inventors: Katsuhiko Hayashi, Shiga; Masataka Kondo, Kobe, both of (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/329,526

(22) Filed: Jun. 10, 1999

(30) Foreign Application Priority Data

Mar. 24, 1999 (JP) .................................................. 11-079077
Mar. 24, 1999 (JP) .................................................. 11-079078

(51) Int. Cl.$^7$ .................................................. H01L 21/00
(52) U.S. Cl. .................................. 438/12; 438/4; 438/10; 438/12; 438/13; 136/243; 136/258; 136/290
(58) Field of Search .................................. 438/12, 13, 4, 438/139, 466

(56) References Cited

U.S. PATENT DOCUMENTS

| 4,166,918 | 9/1979 | Nostrand ............................... 136/243 |
| 4,464,823 | 8/1984 | Izu et al. ................................ 438/12 |
| 4,806,496 | 2/1989 | Suzuki et al. ......................... 438/12 |
| 5,418,680 | * 5/1995 | Saito et al. ........................... 361/225 |

FOREIGN PATENT DOCUMENTS

| 56-83981 | 7/1981 | (JP) | ............................... H01L/31/18 |
| 59-94468 | 5/1984 | (JP) | ............................... H01L/31/04 |
| 60-46080 | 3/1985 | (JP) | ............................... H01L/31/04 |
| 61-85873 | 5/1986 | (JP) | ............................... H01L/31/04 |
| 63-41081 | 2/1988 | (JP) | ............................... H01L/31/04 |
| 63-88869 | 4/1988 | (JP) | ............................... H01L/31/04 |
| 3-23677 | 1/1991 | (JP) | ............................... H01L/31/04 |
| 10-12901 | 1/1998 | (JP) | ............................... H01L/31/04 |
| 10-4202 | 1/1998 | (JP) | ............................... H01L/31/04 |

* cited by examiner

*Primary Examiner*—Charles Bowers
*Assistant Examiner*—Asok K. Sarkar
(74) *Attorney, Agent, or Firm*—Hogan & Hartson, LLP.

(57) ABSTRACT

A method for removing short circuits in thin film solar cell elements during manufacturing by applying a pseudo-alternating voltage between the substrate side and the back electrodes of the solar cell elements. The waveform of the pseudo-alternating voltage may be a sinusoidal wave, a half-wave sinusoidal wave, a sawtooth wave, a square wave or the like. The peak voltage in the reverse direction is up to the reverse breakdown voltage of the solar cell element, and the waveform may either contain a small forward component or no fond component The peak voltage in Se reverse direction may also momentarily exceed the reverse breakdown voltage. The period of the pseudo-alternating voltage matches the tine constant of the solar cell element determined by the capacity and reverse resistance of the solar cell element. The pseudo-alternating voltage induces an alternating current which discharges the accumulated charges in the solar cell element, thereby protecting it from high voltages generated by accumulated charges. Consequently, the method effectively removes short-circuits in the semiconductor layer without damaging non-short-circuited sections of the semiconductor layer.

29 Claims, 3 Drawing Sheets

US 6,228,662 B1

METHOD FOR REMOVING SHORT-CIRCUITED SECTIONS OF A SOLAR CELL

BACKGROUND OF THE INVENTION

1. Field of the Invention

This invention relates to the fabrication of solar cells, and in particular, to a method of removing short circuits in solar cell elements during manufacturing.

2. Description of the Related Art

As shown in FIG. 1, a thin film solar cell 10 comprises a plurality of solar cell elements 5a, 5b and 5c formed on an insulating substrate 1. Each solar cell element 5 comprises a first electrode 2 formed on one face of substrate 1 in a preset pattern; a semiconductor layer 3 for performing photoelectric conversion which is formed on the surface of the first electrode 2 and a second electrode 4 formed on the surface of the photoelectric-conversion semiconductor layer 3. The semiconductor layer 3 may consist of a non-crystalline semiconductor. The plurality of solar cell elements 5a, 5b and 5c are connected in series by connecting the first electrode 2a of solar cell element 5a to the second electrode 4b of neighboring solar cell element 5b, and the first electrode 2b of solar cell element 5b to the second electrode 4c of neighboring solar cell element 5c.

When a glass substrate, a transparent resin substrate or the like is used as the insulating substrate 1 of the solar cell, a transparent electrode material such as ITO (Indium Tin Oxide, indium oxide mixed with tin oxide) or the like is used as the first electrode 2, and a metal electrode material is used as the second electrode 4. When a nontransparent material is used as the insulating substrate 1, a metallic electrode material is used as the first electrode 2, and a transparent electrode material is used as the second electrode 4.

In the case where the semiconductor layer 3 is a non-crystalline silicon base semiconductor, non-crystalline silicon consisting of alloy of silicon and carbon or other metal such as germanium, tin, etc. may be used, as well as non-crystalline silicon, hydrogenated non-crystalline silicon, hydrogenated non-crystalline silicon carbide, or non-crystalline silicon nitride. Furthermore, these non-crystalline or polycrystalline semiconductor materials may be used in the form of pin-type, nip-type, ni-type, pn-type, MIS-type, heterojunction-type, homojunction-type, Schottky barrier-type, or a combination of the above. Also, the semiconductor layer may be formed by using not only a silicon base but also a Cd base, GaAs base, InP base, etc.

When, for example, a short-circuit occurs between the first electrode 2b and the second electrode 4b of solar cell element 5b by a pinhole formed in the photoelectric-conversion semiconductor layer 3b during manufacturing, it is well known to remove the short-circuited section or to insulate it by oxidation When a short-circuited section to be removed is between the first electrode 2b on the substrate side of the solar cell element 5b and the second electrode 4b on the back side of the photoelectric-conversion semiconductor layer 3b, probe electrodes 6a and 6b contacting electrodes 4b and 4c, respectively, are used. A DC voltage or voltage of a square-wave pulse, not exceeding the reverse limit voltage (reverse breakdown voltage), is applied in the reverse direction (0 V side), as shown in FIG. 2, between the first electrode 2b and the second electrode 4b that sandwich the photoelectric-conversion semiconductor layer 3b. The electric current is concentrated at the short-circuited section which generates Joule heat. Oxidation of metal occurs due to the generated Joule heat. The oxidation of metal insulates the short-circuited section. Another method of removing the short circuit involves removing the short-circuited section by dissipation of the metal.

However, a solar cell is equivalent to a diode. Thus, when the voltage is applied in the reverse direction between the electrode 2 and the electrode 4, the solar cell element 5 consisting of the first electrode 2, the photoelectric-conversion semiconductor layer 3 and the second electrode 4 functions as a capacitor, and charges accumulate across the capacitor. As a result, when the DC voltage is applied between electrodes 2 and 4, charges remain between electrodes 2 and 4 even after the applied voltage has been removed abruptly. The voltage generated by these charges may cause electrical breakdown in weak sections of the photoelectric-conversion semiconductor layer 3 other than the locations where the faults occur.

To avoid such accumulated charges and the high voltage generated by such charges, the voltage of the square-wave pulse applied to the electrodes to induce oxidation (FIG. 2) is typically restrained to levels much lower than the reverse limit voltage. Typically, a 4 V voltage pulse is applied in the reverse direction. However, such a low-voltage pulse often does not generate sufficient Joule energy, and consequently, not all of the short-circuited sections can be removed or oxidized by the generated Joule heat. At the same time, some breakdown of the non-short-circuited normal sections by discharge of the accumulated charges still occurs at certain sections where the limit voltage of the semiconductor is low.

SUMMARY OF THE INVENTION

Accordingly, the present invention is directed to a method for removing short-circuited sections in a thin film solar cell element that substantially obviates one or more of the problems due to limitations and disadvantages of the related art.

An object of the present invention is to provide a method that allows reliable removal of short-circuited sections by a voltage source applied in the reverse direction between the electrodes without damaging non-short-circuited sections.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a method of removing short-circuited sections in a thin film solar cell element comprising applying a pseudo-alternating voltage between the first and second electrodes of the solar cell element. This voltage induces an alternating current which discharges the accumulated charges in the solar cell element, thereby protecting it from high voltages generated by accumulated charges.

The voltage of the pseudo-alternating voltage changes periodically with time. The waveform of the pseudo-alternating voltage may be a sinusoidal wave, a half-wave sinusoidal wave, a sawtooth wave, a square wave, etc. The peak voltage in the reverse direction is up to the reverse breakdown voltage of the solar cell element, and the waveform may either contain a small forward component or no forward component. The period of the pseudo-alternating voltage matches the time constant of the solar cell element determined by the capacitance and reverse resistance of the solar cell element.

It is to be understood that both the foregoing general description and the following detailed description are exemplary and explanatory and are intended to provide further explanation of the invention as claimed.

DETAILED DESCRIPTION OF THE PREFERRED EMBODIMENTS

Figure 1:
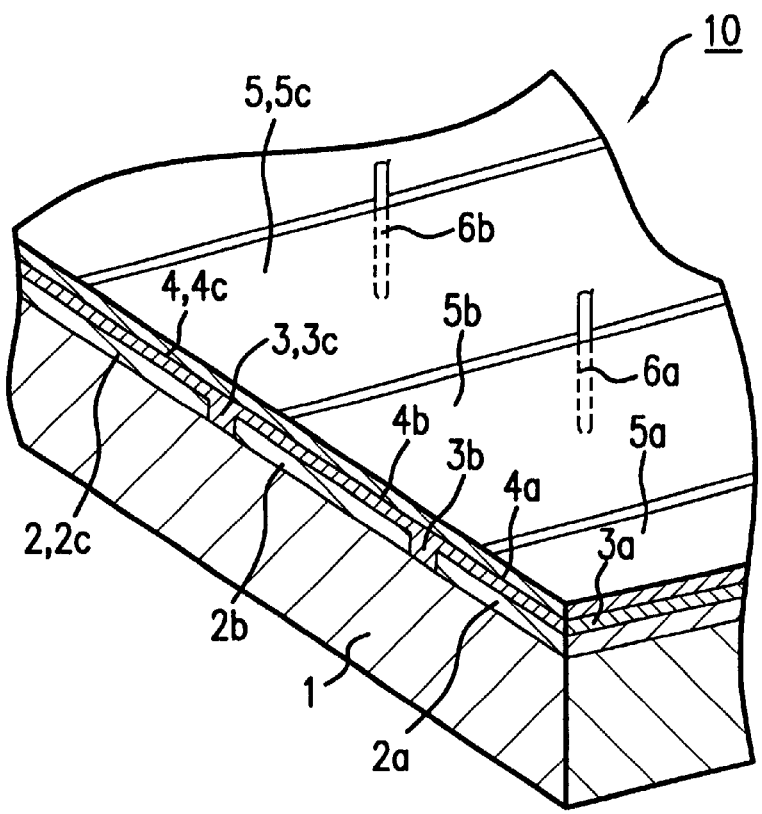
FIG. 1 illustrates a thin film solar cell device.

Refereeing to FIG. 1, to remove a short-circuited section in the photoelectric-conversion semiconductor layer 3b of a thin film solar cell element 5b, a voltage is applied between the first electrode 2b on the substrate side of the semiconductor layer 3b and the second electrode 4b on the back side of the semiconductor layer 3b, through probe electrodes 6b and 6a connected to electrodes 4c and 4b, respectively. The applied voltage has a pseudo-alternating waveform, some examples of which are shown in FIGS. 3A–3C and 4A–4D.

Figure 3A:
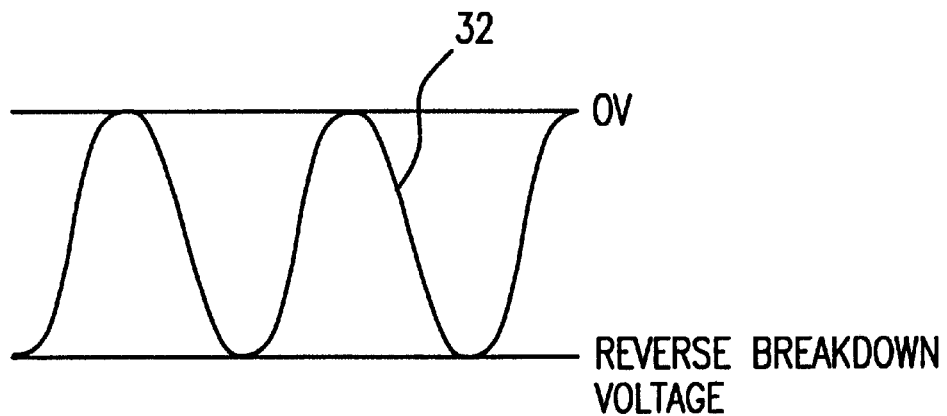
FIGS. 3A–3C illustrate waveforms of a voltage applied to a solar cell element to remove a short-circuited section according to an embodiment of the present invention.

In FIG. 3A, the applied pseudo-alternating voltage 32 has a sinusoidal waveform that alters between 0 V and a reverse peak voltage which is set case by case and upto the reverse limit voltage, which is typically about 8 V. By applying a voltage having such a waveform, the applied voltage is gradually brought close to 0 V, i.e., the reverse voltage is reduced, from a peak reverse voltage. Thus, the charges accumulated between the first and second electrodes 2b and 4b decrease with decreasing magnitudes of the applied voltage, and a breakdown at non-short-circuited normal sections is avoided.

Figure 3B:
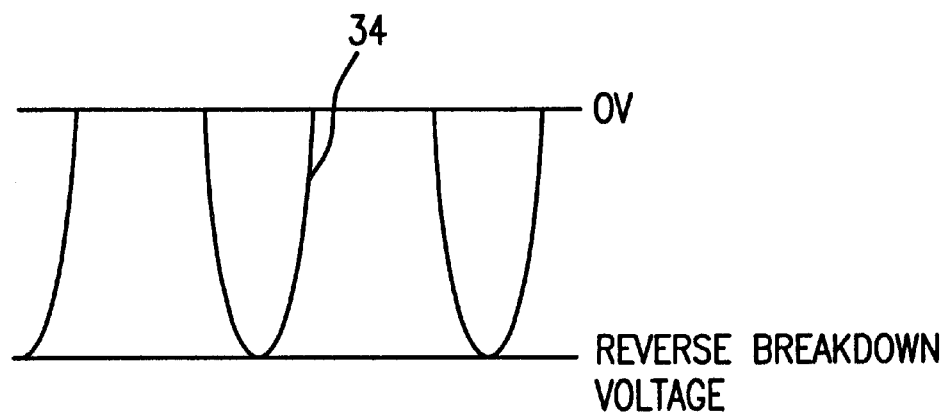

FIG. 3B shows another example of the applied pseudo-alternating voltage 34 having the shape of the lower half of a sinusoidal wave. The peak value in the reverse direction is approximately equal to the reverse breakdown voltage of the solar cell element, and the applied voltage is 0 V during half of the time. Again, the charges accumulated between the electrodes 2b and 4b are discharged during the time period when the reverse voltage decreases in size, and also during the period when the applied voltage is 0 V. Thus, a breakdown at non-short-circuited normal sections is avoided.

Figure 3C:
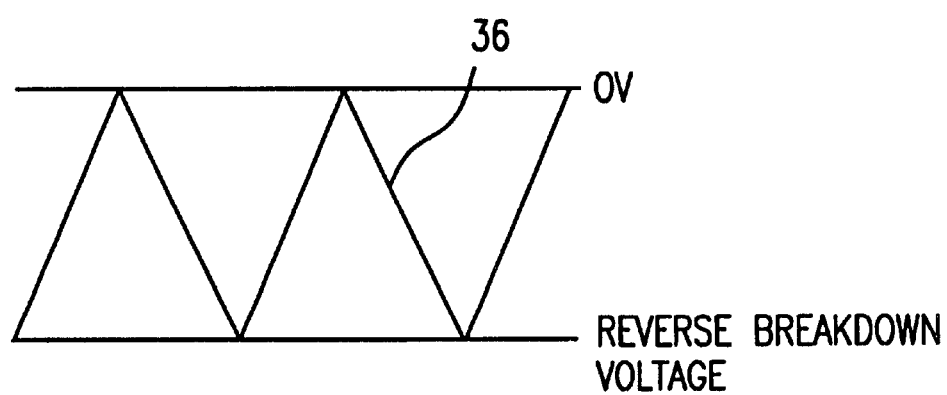

FIG. 3C shows yet another example of the applied pseudo-alternating voltage 36 which has a sawtooth-shaped waveform. The peak value in the reverse direction is again set case by case and is upto the reverse limit voltage of the solar cell element, while the voltage level of the other peaks of the sawtooth wave is 0 V. Similar to the embodiments of FIGS. 3A and 3B, the charges accumulated between the electrodes 2b and 4b decrease with decreasing magnitudes of the applied voltage, and a breakdown at non-short-circuited normal sections is again avoided. In the embodiments of FIGS. 3A–3C, although the peak voltage in the reverse direction is shown to be at the reverse breakdown voltage of the solar cell element, they can also be less than the reverse breakdown voltage. In addition, it is possible to raise the peak voltage in the reverse S direction momentarily to a value exceeding the reverse breakdown voltage of the solar cell, such as 10 V.

Figure 4A:
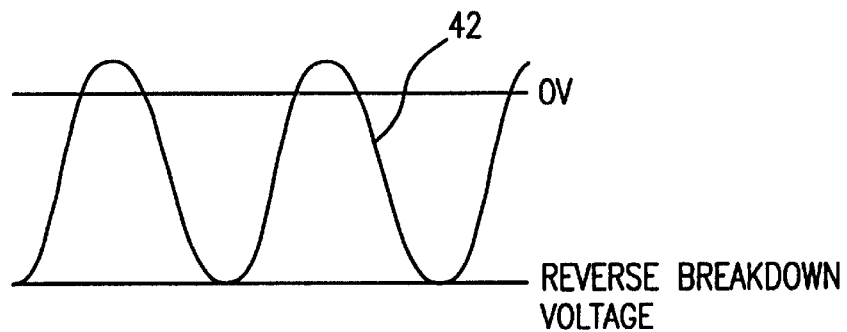
FIGS. 4A–4D illustrate waveforms of a voltage applied to a solar cell element to remove a short-circuited section according to another embodiment of the present invention.

FIGS. 4A–4D illustrate other embodiments of the present invention where the applied pseudo-alternating voltage has a large reverse component and a smaller forward component. In FIG. 4A, the applied pseudo-alternating voltage 42 has a sinusoidal waveform. Preferably, the peak voltage in the reverse direction is at least 1 V (shown in the figure to be approximately equal to the reverse breakdown voltage), while the peak voltage in the forward direction is approximately 0.5 V.

Figure 4B:
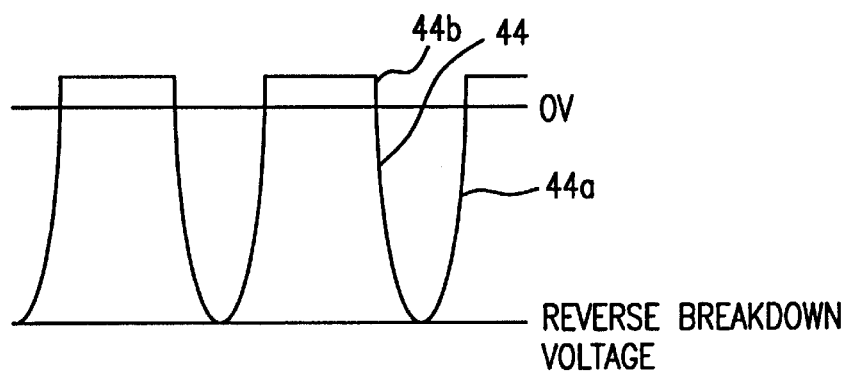

FIG. 4B shows another example of the applied pseudo-alternating voltage 44 having the shape of a truncated sinusoidal wave. The reverse component 44a of the applied voltage comprises the lower half of the sinusoidal wave having a reverse peak value which is set case by case, whose magnitude is about the same as other wave form, while the forward component 44b comprises a truncated portion of the sinusoidal wave having a flat top, preferably not exceeding 0.2 V.

Figure 4C:
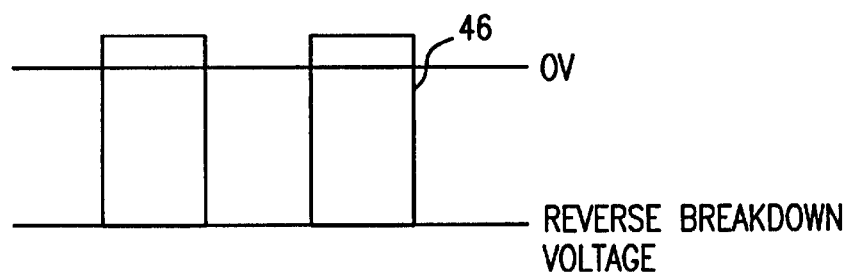

FIG. 4C shows another example of the applied pseudo-alternating voltage 46 having a square-shaped waveform comprising a large reverse component and a small forward component, which does not exceed 0.2 V.

Figure 4D:
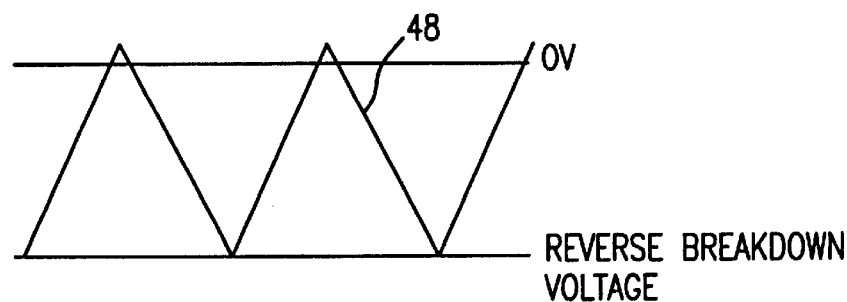

FIG. 4D shows another example of the applied pseudo-alternating voltage 48 having a sawtooth waveform comprising a Large reverse component and a small forward component, which does not exceed 0.2 V.

In the embodiments of FIGS. 4A–4D, by applying the pseudo-alternating voltage having such a waveform, the charges accumulated between the electrodes 2b and 4b are discharged when the forward voltage component is applied. As a result, a breakdown of non-short-circuited normal sections of the solar cell element is avoided. Furthermore, since the adverse effect of charges accumulation is reduced or eliminated by the forward component, the reverse voltage can be increased momentarily to a level higher than the reverse breakdown voltage of the solar cell element, for example as high as 10 V, resulting in more reliable removal of the short-circuited sections.

Figure 2:
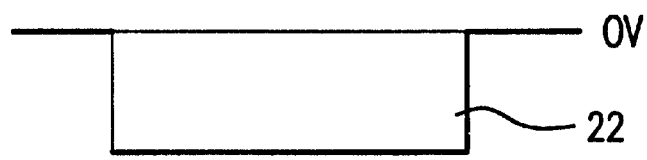
FIG. 2 illustrates a voltage applied to a solar cell element to remove a short-circuited section according to the conventional technique.

In one test, a pseudo-alternating voltage having a waveform shown in FIG. 3A was applied between the first and second electrodes of 60 serially connected solar cell elements which contained short-circuits. As a result, short-circuits in 57 of the 60 cells were removed. In another test, a pseudo-alternating voltage having a waveform shown in FIG. 4A was applied, and short-circuits in 58 of the 60 cells were removed. As a comparison, when a conventional square-wave pulse of 4 V as shown in FIG. 2 was applied, short circuits were removed in only 50 out of 60 cells.

In one embodiment of the present invention, a 60 Hz AC power supply is applied to the first and second electrodes of the solar cell element as the source of the pseudo-alternating voltage for short-circuit removal. More preferably, the period of the applied pseudo-alternating voltage is selected to approximately match the time constant of the solar cell element defined by the capacitance C and the resistance R in the reverse direction of the cell. This leads to more effective discharge of the accumulated charges. In preferred embodiments of the present invention, the frequency of the applied pseudo-alternating voltage is between about 20 to 1000 Hz, and more preferably between about 50 to 120 Hz.

It will be apparent to those skilled in the art that various modifications and variations can be made in a method of fabricating a thin film transistor of the present invention without departing from the spirit or scope of the inventions. For example, while several examples of pseudo-alternating waveforms are shown in FIGS. 3A–3C and 4A–4D, other waveforms may also be used, as long as they contain a relatively large reverse component and no forward component or a relatively small forward component. Moreover, the peak voltages in the reverse and forward directions may be larger or smaller than those shown and described above. In addition, the pseudo-alternating voltage need not be strictly periodic. Thus, it is intended that the present invention covers modifications and variations of this invention provided they come within Me scope of the appended claims and equivalents.

What is claimed is:

1. A method of removing short circuits in a solar cell element comprising a first and a second electrode layer and a semiconductor layer for photoelectric conversion disposed between the first and second electrode layers, the method comprising applying a pseudo-alternating voltage across the first and second electrode layers, the pseudo-alternating voltage containing a reverse component in a reverse direction and a forward component in a forward direction, the forward component being substantially smaller in magnitude than the reverse component.

2. The method of claim 1, wherein the magnitude of the forward component is zero.

3. The method of claim l, wherein the magnitude of the reverse component is less than a reverse breakdown voltage of the solar cell element.

4. The method of claim 1, wherein the magnitude of the reverse component substantially equals a reverse breakdown voltage of the solar cell element.

5. The method of claim 1, wherein the magnitude of the reverse component is greater than a reverse breakdown voltage of the solar cell element.

6. The method of claim 1, wherein the magnitude of the forward component is nonzero and wherein the magnitude of the reverse component is about 10 V.

7. The method of claim 1, wherein the magnitude of the forward component is zero and wherein the magnitude of the reverse component is about 8 V.

8. The method of claim 1, wherein the pseudo-alternating voltage has a sinusoidal wave-form.

9. The method of claim 8, wherein the sinusoidal waveform alters between 0 V and a reverse voltage.

10. The method of claim 9, wherein the reverse voltage is approximately equal to a reverse breakdown voltage of the solar cell element.

11. The method of claim 8, wherein the sinusoidal waveform varies between a forward voltage and a reverse voltage, the forward voltage being substantially smaller in magnitude than the reverse voltage.

12. The method of claim 11, wherein the forward voltage is less than about 0.5 V and the reverse voltage is greater than about 1 V.

13. The method of claim 1, wherein the pseudo-alternating voltage has a truncated sinusoidal waveform.

14. The method of claim 13, wherein the truncated sinusoidal waveform is a half-wave sinusoidal waveform varying between 0 V and a reverse voltage.

15. The method of claim 14, wherein the reverse voltage is approximately equal to a reverse breakdown voltage of the solar cell element.

16. The method of claim 13, wherein the truncated sinusoidal waveform varies between a forward voltage and a reverse voltage, the forward voltage being substantially smaller in magnitude than the reverse voltage.

17. The method of claim 16, wherein the forward voltage is less than about 0.2 V and the reverse voltage is greater than about 1 V.

18. The method of claim 1, wherein the pseudo-alternating voltage has a sawtooth waveform.

19. The method of claim 18, wherein the sawtooth waveform varies between 0 V and a reverse voltage.

20. The method of claim 19, wherein the reverse voltage is approximately equal to a reverse breakdown voltage of the solar cell element.

21. The method of claim 18, wherein the sawtooth waveform varies between a forward voltage and a reverse voltage, the forward voltage being substantially smaller in magnitude than the reverse voltage.

22. The method of claim 21, wherein the forward voltage is less than about 0.5 V and the reverse voltage is greater than about 1 V.

23. The method of claim 1, wherein the pseudo-alternating voltage has a square waveform.

24. The method of claim 23, wherein the square waveform varies between a forward voltage and a reverse voltage, the forward voltage being substantially smaller in magnitude than the reverse voltage.

25. The method of claim 24, wherein the forward voltage is less than about 0.2 V and the reverse voltage is greater than about 1 V.

26. The method of claim 1, wherein the applied pseudo-alternating voltage is periodic.

27. The method of claim 26, wherein the period of the pseudo-alternating voltage substantially matches a time constant of the solar cell element determined by a capacitance and a resistance in a reverse direction of the solar cell element at the time the pseudo-alternating voltage is applied.

28. The method of claim 26, wherein the frequency of the pseudo-alternating voltage is between about 20 to 1000 Hz.

29. The method of claim 26, wherein the frequency of the pseudo-alternating voltage is between about 50 to 120 Hz.

* * * * *